United States Patent
Colinge et al.

(10) Patent No.: US 6,359,311 B1
(45) Date of Patent: Mar. 19, 2002

(54) QUASI-SURROUNDING GATE AND A METHOD OF FABRICATING A SILICON-ON-INSULATOR SEMICONDUCTOR DEVICE WITH THE SAME

(75) Inventors: Jean Pierre Colinge, Carmichael; Carlos H. Diaz, Mountain View, both of CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 09/761,889

(22) Filed: Jan. 17, 2001

(51) Int. Cl.[7] .................. H01L 27/01; H01L 27/12; H01L 31/0392
(52) U.S. Cl. ........................... 257/347; 257/401
(58) Field of Search .................. 257/327, 347, 257/348, 349, 350, 388, 401

(56) References Cited

U.S. PATENT DOCUMENTS

| | | | | |
|---|---|---|---|---|
| 5,289,027 A | * | 2/1994 | Terrill et al. | 257/327 |
| 5,627,395 A | * | 5/1997 | Witek et al. | 257/350 |
| 6,100,159 A | * | 8/2000 | Krivokapic | 438/413 |

* cited by examiner

*Primary Examiner*—David Nelms
*Assistant Examiner*—David Nhu
(74) *Attorney, Agent, or Firm*—Darby & Darby

(57) ABSTRACT

The present invention discloses a method of fabricating a SOI semiconductor device with a quasi surrounding gate in the silicon substrate to increase the device current per unit device width, and allows better control over the short-channel effect and sub-threshold leakage. This method also enables fabrication of variable gate-length devices using conventional techniques compared to vertical/pillar transistors.

2 Claims, 5 Drawing Sheets

QUASI-SURROUNDING GATE AND A METHOD OF FABRICATING A SILICON-ON-INSULATOR SEMICONDUCTOR DEVICE WITH THE SAME

BACKGROUND OF THE INVENTION

1. Field of the Invention

The present invention relates to silicon-on-insulator semiconductor devices, and more particularly to a quasi surrounding gate and a method of fabricating a SOI semiconductor device with the same to increase the current per device unit length and allows better control over short-channel effects.

2. Description of the Prior Art

The active element common to many microelectronic circuits is the SOI metal-oxide-semiconductor field-effect transistors (MOSFETs). A conventional MOSFET operates by driving current through the channel region between the source and drain of the device. The conductivity of the channel region is modulated by the application of a voltage on the conducting gate above the channel surfaces and insulated from it. Efforts are ongoing within many MOS integrated circuit manufacturing companies as well as laboratories to improve the speed and available drive current of the SOI MOSFET, to improve its reliability and reduce its power consumption.

SOI is the generic term describing those technologies in which the MOSFETs or other active devices are built in a thin film of silicon over an insulating layer or substrate. The presence of the insulator reduces the parasitic capacitance in the MOSFET compared to a bulk silicon device, resulting in inherent improvements in the speed and power dissipation of MOS integrated circuits, as well as improved immunity to single-event upset of MOS memory elements in a radiation environment.

Present MOS transistors drive current flow in a surface-inversion layer, such as shown in FIG. 1. In between a source area 11 and a drain area 12 at the ends of the channel, the surface-inversion layer 14 formed within serves as a pathway to drive the current when a voltage is applied at gate 13.

However, due to the limited current available in a surface inversion-layer at the top silicon interface of a MOS transistor, improvement is essential to be able to provide better performance and at the same time, being able to prevent short-channel effect, drain-induced barrier lowering and sub-threshold slope degradation.

SUMMARY OF THE INVENTION

In view of the above problems, the invention seeks to provide a quasi surrounding gate MOSFET.

Another object of the invention is to provide a quasi surrounding gate MOSFET having an improved current drive and transconductance.

Another object of the invention is to form a quasi surrounding gate MOSFET using Silicon On Insulator wafer.

Yet another object of the invention is to provide a method for fabricating a quasi surrounding gate by volume-inversion on an SOI wafer. The so called volume-inversion means that inversion is not only observed in a surface channel at the top interface of the semiconductor, but inside the volume of the semiconductor layer and at along its sides.

Still another object of the invention is to fabricate a quasi surrounding gate structure with better control over short-channel effects and sub-threshold leakage.

The invention takes advantage of SOI wafers, bulk silicon wafers and conventional processing techniques using new methods to form a novel quasi surrounding gate MOSFET structure. The method for forming a quasi surrounding gate MOSFET described herein employs conventional MOS processing steps in combination with well-established SOI techniques. Therefore, the invention enables the forming of a semiconductor device with a quasi surrounding gate to be manufactured using only established process techniques, that have been used in the past to construct bulk or SOI MOSFETs.

According to an embodiment of the invention, the steps of fabricating a silicon-on-insulator semiconductor device with quasi surrounding gate, comprising:

(a). forming a semiconductor layer on a semiconductor substrate via a first insulation layer;

(b). forming an first oxide layer on the semiconductor layer;

(c). forming a sacrificial nitride layer on the oxide layer;

(d). patterning the layers of the semiconductor, the oxide and the sacrificial nitride into an island or a strip by a lithographic process;

(e). forming a second oxide layer around the semiconductor layer;

(f). stripping the sacrificial nitride layer;

(g). depositing a second sacrificial nitride layer along the semiconductor layer;

(h). using the second sacrificial nitride layer as a mask and etching the first insulation layer to a depth;

(i). forming dielectric material around the island or the strip of the semiconductor layer;

(j). using the second sacrificial nitride layer as a mask and depositing polysilicon;

(k). removing the second sacrificial nitride layer; and (l). forming source and drain regions in the semiconductor layer by implanting doping ions whose conductivity type is opposite to that of the semiconductor substrate, using the gate electrode as a mask.

The structure of the quasi surrounding gate of the invention, such as FIG. 2, mainly comprises a first insulating layer 21; a submicron-thick semiconductor layer 22 on the first insulating layer 21, the semiconductor layer 22 having a generally intrinsic bulk channel region; a gate insulating layer 23 surrounding the semiconductor layer; and a gate 24, almost enclosing the gate insulating layer fully.

As shown in FIG. 3, 31 represents a first insulating layer, 32 represents a semiconductor layer, 33 represents a gate insulating layer, and 34 represents a gate.

BRIEF DESCRIPTION OF THE DRAWINGS

The invention will become more fully understood from the detailed description given hereinbelow and the accompanying drawings, given by way of illustration only and thus not intended to be limitative of the present invention.

DETAILED DESCRIPTION OF THE INVENTION

Figure 4:
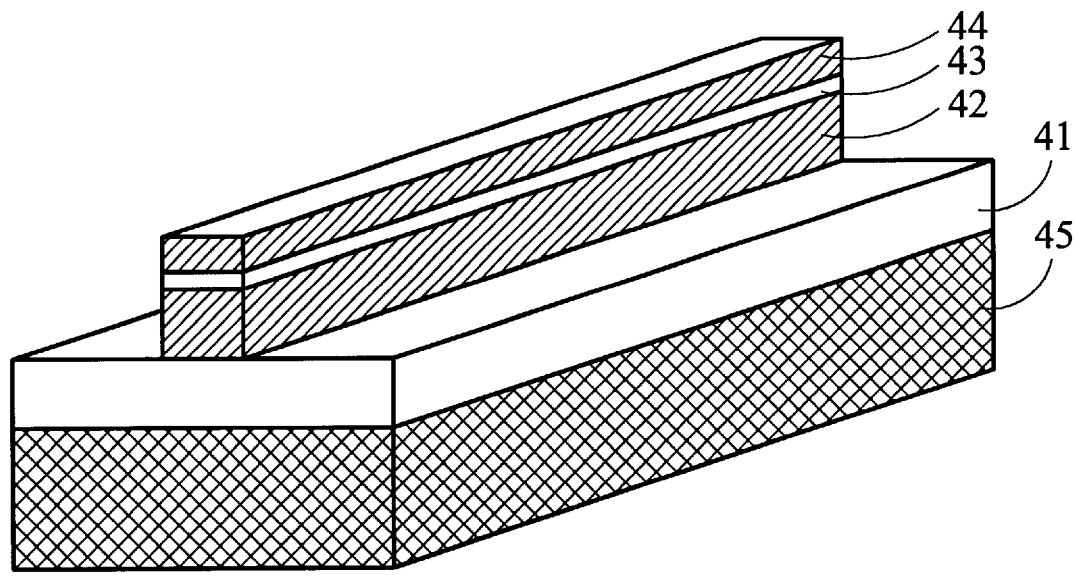
FIGS. 4–10 show the steps of forming the quasi surrounding gate according to the invention.
Figure 5:
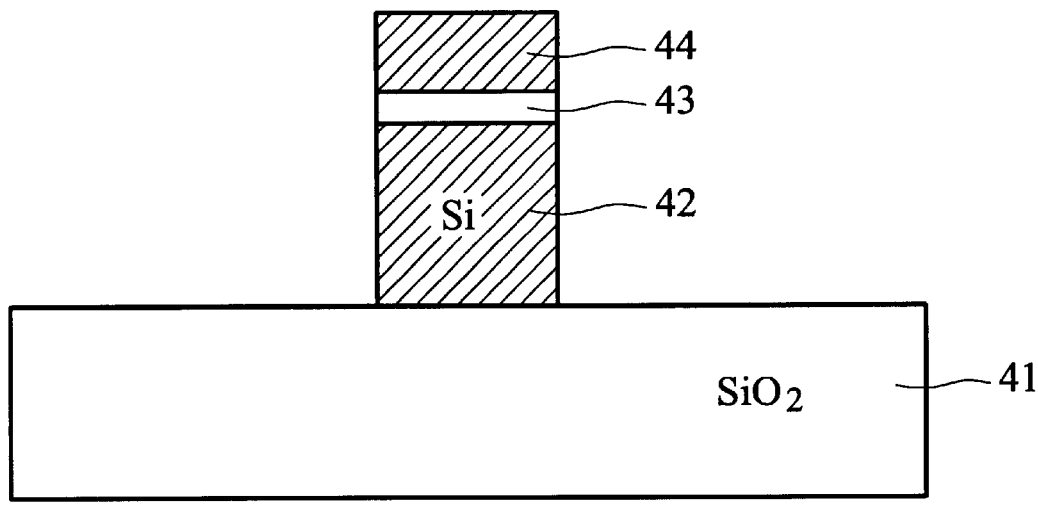

The method of fabricating a SOI MOSFET semiconductor device with a quasi surrounding gate of the invention can either start with an SOI structure, or starting with a semiconductor substrate 45, and forming a semiconductor layer 42 on the semiconductor substrate 45 via a first insulation layer 41, shown in FIG. 4. Next, a first oxide layer 43 and a sacrificial nitride layer 44 is sequentially formed, followed by lithographically forming the semiconductor, the oxide and the sacrificial nitride into a long strip, as shown in FIG. 4. FIG. 5 is a cross-sectional view of FIG. 4.

Figure 6:
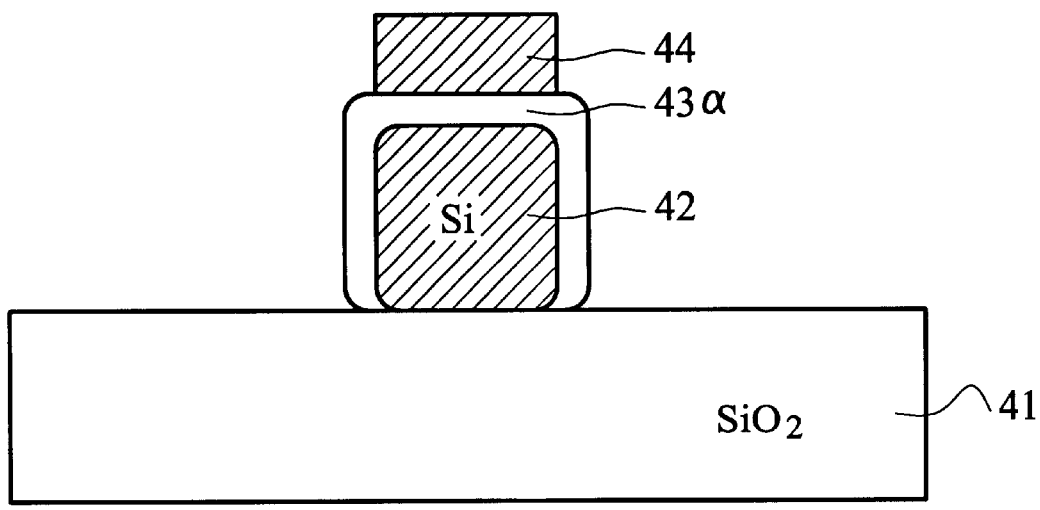

Next, in FIG. 6, a second oxide layer 43α is formed around the semiconductor layer 42 to round off the corners of the semiconductor layer. By doing so, the gate insulator breakdown characteristics can be improved, and the field-enhanced tunneling through the gate dielectric is avoided. Any conventional method of forming oxide layers can be applied, such as deposition, and thermal oxidation.

Figure 3:
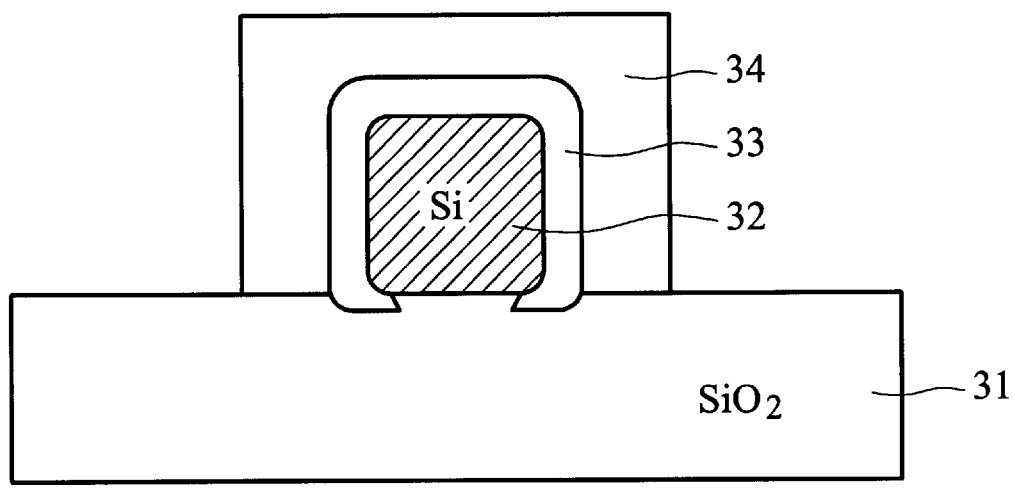
FIG. 3 is a cross-sectional diagram of another embodiment of the quasi surrounding gate constructed in accordance with the invention.
Figure 7:
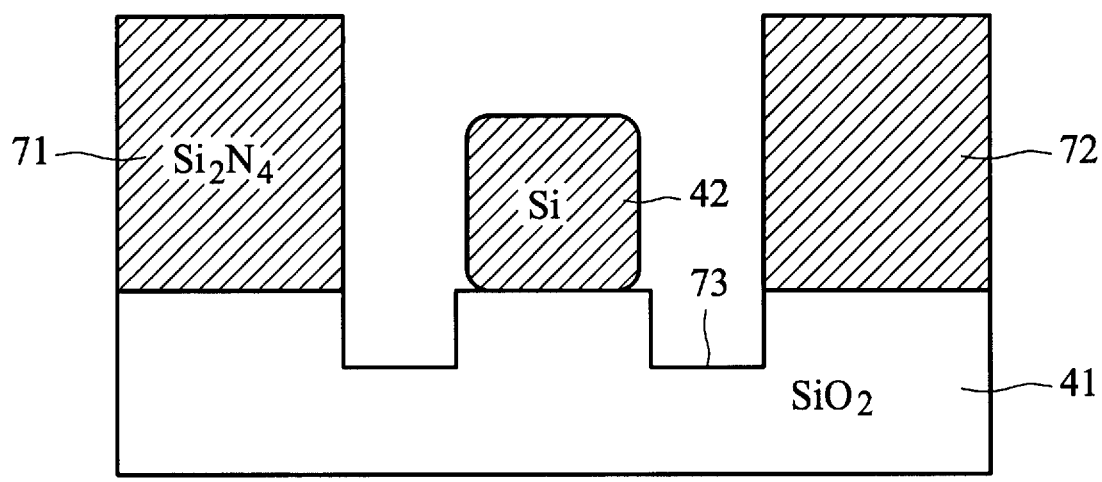

Thereafter, the sacrificial nitride layer 44 is stripped, followed by forming a new sacrificial nitride layer 71, 72 and patterned as shown in FIG. 7. Using the nitride layer 71, 72 as a mask, the buried oxide layer 41 is etched to a certain depth 73. This depth 73 to be etched is optional, considering that the obtained gate would still work even if the depth is 0, as shown in FIG. 3. However, the depth is preferably between 10 and 100 nm. At this point, the oxide layer 43α used to round off the corners of the semiconductor layer is etched away. Similarly, any conventional methods for stripping and etching can be applied.

Figure 8:
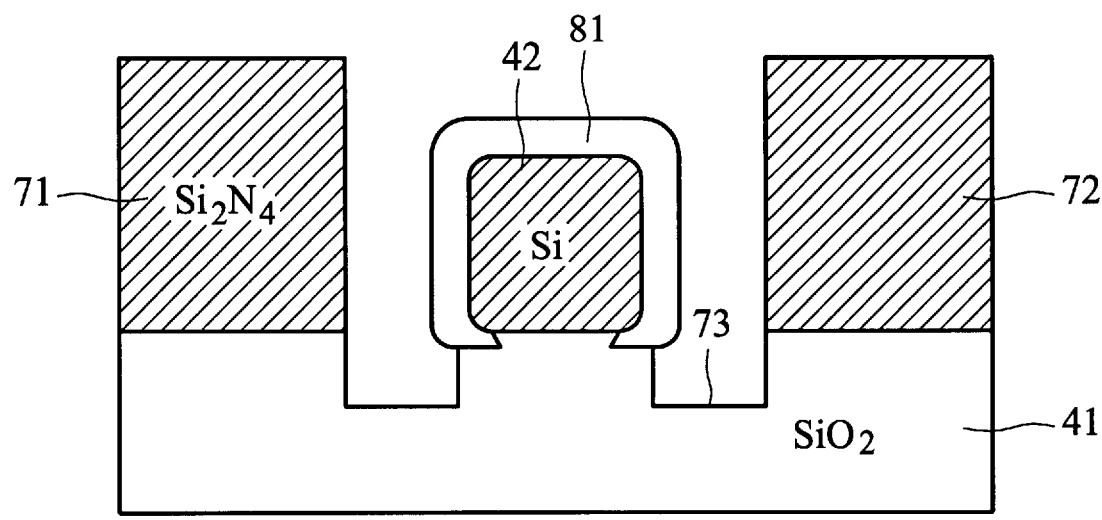

Then, as shown in FIG. 8, the threshold voltage implantation is done by forming a dielectric material 81 around the semiconductor layer 42. The most suitable dielectric material is selected from silicon dioxide, silicon nitride, silicon oxinitride, and high-K dielectric material.

Figure 9:
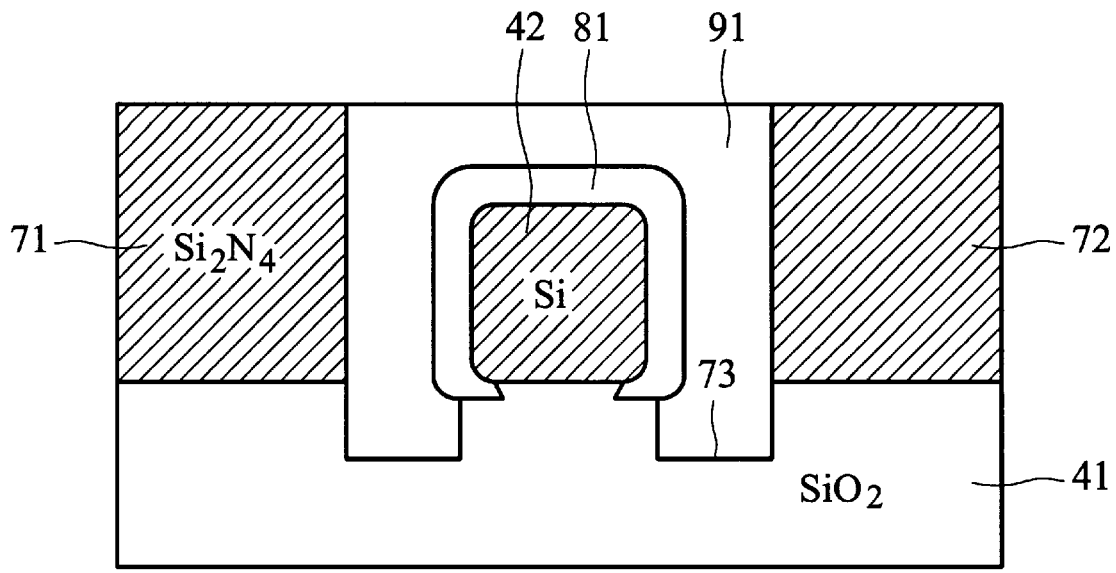

Next, gate material, such as polysilicon 91 is deposited, as shown in FIG. 9. The gate material is not limited to polysilicon, any conventional material, such as a metal gate, can also be used. Then, planarization is performed to polish the surface. The conventional polishing technique, such as chemical-mechanical polishing CMP or organic material deposition and reactive ion etching (RIE) can be used.

Figure 10:
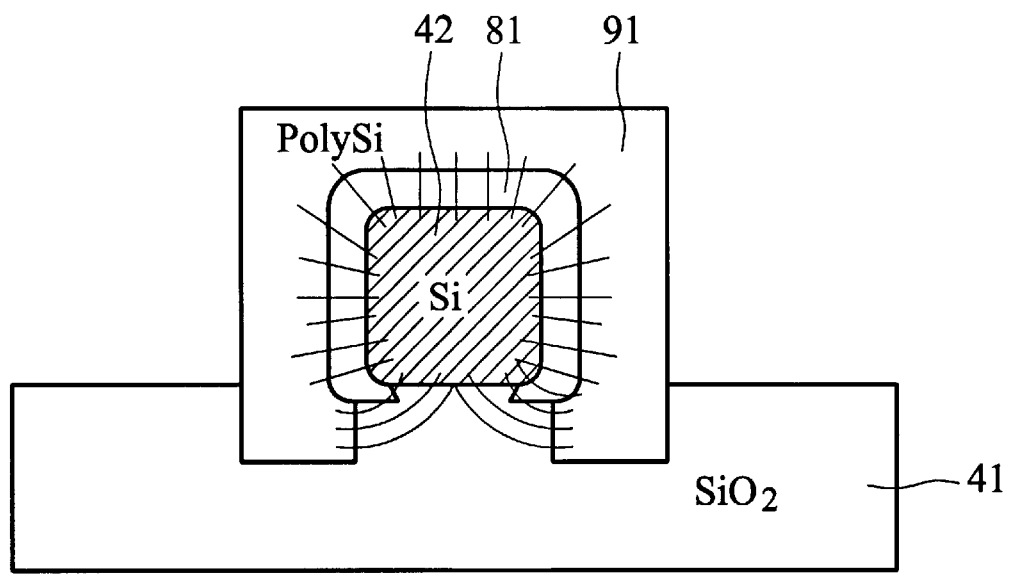

At this stage, due to the small lateral dimensions of the device (less than 100 nm), field lines from the gate will terminate on the back of the device, thereby acting as a virtual back gate. Thereafter, the sacrificial nitride layers 71, 72 are removed as shown in FIG. 10.

Finally, source and drain regions are formed, as in a regular MOSFET, in the semiconductor layer by implanting doping ions whose conductivity type is opposite to that of the semiconductor substrate, using the gate electrode as a mask.

Figure 1:
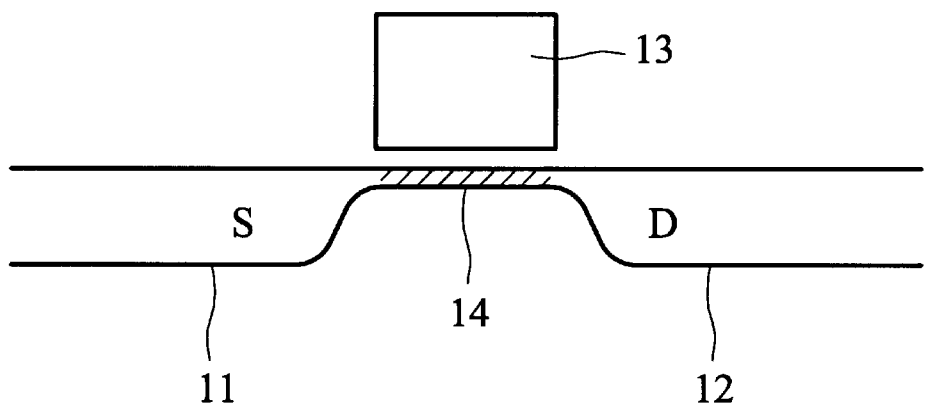
FIG. 1 is a cross-sectional diagram of a conventional MOSFET with an surface-inversion layer arranged in an SOI configuration.

For the quasi surrounding gate of the invention, the thickness of the semiconductor layer is preferably less than 200 nm. The structure of the quasi surrounding gate according to the invention is shown in FIG. 1.

The quasi surrounding gate structure of the invention is formed in an SOI configuration, preferably upon a buried oxide layer, which in turn is provided on a bulk semiconductor substrate. The resulting MOSFET avoids short-channel effects and otherwise has improved the current drive compared to prior MOSFETs.

Accordingly, the invention provides a method of fabricating a SOI MOSFET semiconductor device with a quasi surrounding gate.

The following embodiment comprises the steps of fabricating a N-channel device with the quasi surrounding gate according to an embodiment of the invention, but the same principles apply for fabricating a P-channel device, provided that appropriate changes of the conductivity are applied.

Starting with a P-type semiconductor substrate 45, and forming a semiconductor layer 42 on the semiconductor substrate 45 via a first insulation layer 41; a first oxide layer 43 and a sacrificial nitride layer 44 were sequentially formed, followed by lithographically forming the semiconductor, the oxide and the sacrificial nitride into a long strip, as shown in FIGS. 4 and 5.

Next, in FIG. 6, a second oxide layer 43α is formed around the semiconductor layer 42 to round off the corners of the semiconductor layer.

Thereafter, the sacrificial nitride layer 44 is stripped, followed by forming a new sacrificial nitride layer 71, 72 and patterned as shown in FIG. 7. Using the nitride as a mask, the buried oxide layer 41 is etched to a depth of 110 nm. At this point, the oxide layer 43α is used to round off the corners of the semiconductor layer which is etched away.

Then, as shown in FIG. 8, a dielectric material, silicon oxide 81 is formed around the semiconductor layer.

Next, the gate material, polysilicon 91 is deposited, as shown in FIG. 9. Then, planarization with CMP is performed to polish the surface.

At this stage, due to the small lateral dimensions of the device (less than 100 nm), field lines from the gate will terminate on the back of the device, thereby acting as a virtual back gate. Thereafter, the sacrificial nitride 71, 72 layers are removed as shown in FIG. 10.

Next, source and drain regions are formed, as in a regular MOSFET, in the semiconductor layer by implanting doping ions whose conductivity type is opposite to that of the (P-type) semiconductor substrate, using the gate electrode as a mask.

Figure 2:
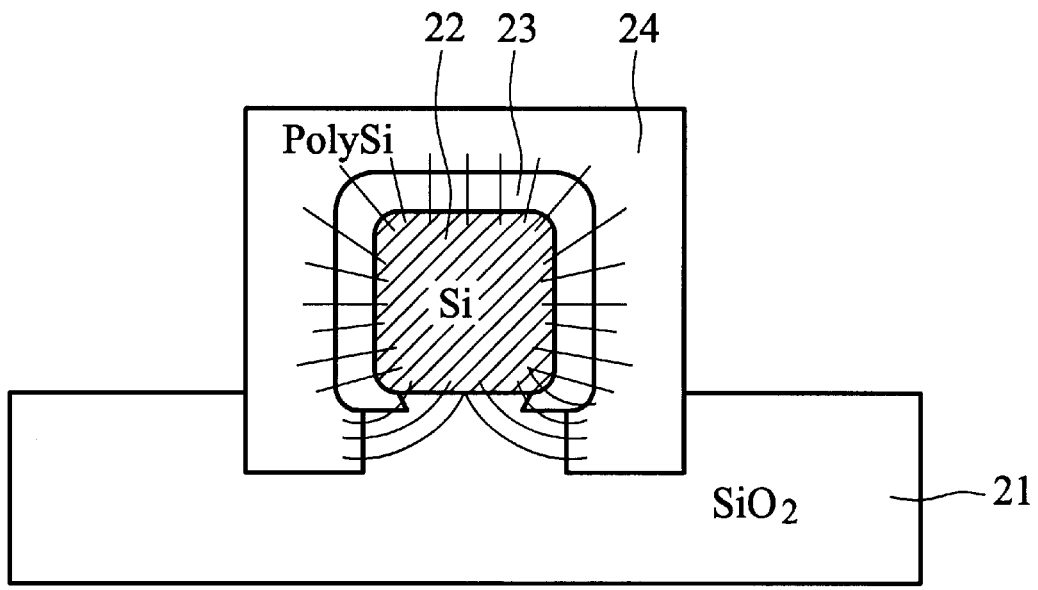
FIG. 2 is a cross-sectional diagram of the quasi surrounding gate constructed in accordance with the invention.

The layout of the quasi surrounding gate formed is shown in FIG. 2, wherein the gate electrode 23 virtually surrounds the channel region. It is obvious that the volume of the channel region of the gate is greater than that of the prior transistor with surface inversion at the top semiconductor interface. Similarly, it is obvious that the sum of surface inversion at the top, lateral sides and part of the bottom interface of the semiconductor layer carries a greater current than in a transistor with surface inversion at the top semiconductor interface only. As a result, the current drive is improved and also, the short channel effects are prevented.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A quasi surrounding gate structure, comprising:
    a first insulating layer;
    a submicron-thick semiconductor layer on the first insulating layer, the semiconductor layer being patterned into an island or a strip;

a gate insulating layer surrounding the island or the strip of the semiconductor layer; and a gate, enclosing the gate insulating material and extending to a distance into the first insulation layer.

2. The structure as claimed in claim 1, wherein the gate insulating layer virtually encloses the semiconductor layer.

* * * * *